(12) United States Patent
Ueda et al.

(10) Patent No.: US 10,379,946 B2
(45) Date of Patent: Aug. 13, 2019

(54) CONTROLLER

(71) Applicant: OMRON Corporation, Kyoto-shi, Kyoto (JP)

(72) Inventors: Takamasa Ueda, Kusatsu (JP); Yasuo Muneta, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 130 days.

(21) Appl. No.: 15/602,329

(22) Filed: May 23, 2017

(65) Prior Publication Data

US 2017/0351573 A1    Dec. 7, 2017

(30) Foreign Application Priority Data

Jun. 6, 2016    (JP) .................................. 2016-112480

(51) Int. Cl.
     *G06F 11/10*      (2006.01)
     *G11C 29/52*      (2006.01)
     *G06F 11/07*      (2006.01)

(52) U.S. Cl.
     CPC ...... *G06F 11/1068* (2013.01); *G06F 11/0751* (2013.01); *G06F 11/1004* (2013.01); *G06F 11/1052* (2013.01); *G11C 29/52* (2013.01)

(58) Field of Classification Search
     CPC ............ G06F 11/0751; G06F 11/1004; G06F 11/1068; G06F 11/1052; G11C 29/52
     See application file for complete search history.

(56) References Cited

U.S. PATENT DOCUMENTS

| | | |
|---|---|---|
| 5,606,662 A | 2/1997 | Wisor |
| 2007/0266277 A1 | 11/2007 | Oyamada |
| 2015/0220378 A1* | 8/2015 | Kanamaru ............... G05B 9/03 714/37 |

FOREIGN PATENT DOCUMENTS

| | | |
|---|---|---|
| EP | 1003290 A2 | 5/2000 |
| EP | 1677193 A2 | 7/2006 |
| JP | 2009-146168 A | 7/2009 |

OTHER PUBLICATIONS

The extended European search report dated Nov. 8, 2017 in the counterpart European patent application.

* cited by examiner

*Primary Examiner* — Guy J Lamarre
(74) *Attorney, Agent, or Firm* — Metrolex IP Law Group, PLLC

(57) ABSTRACT

A controller sets the processing in accordance with an error that may occur in data. A controller for controlling a machine or a facility includes a storage unit, a diagnosis unit that diagnoses the presence of an error in data written in a memory space of the storage unit or data read from the memory space, and a processing unit that performs processing in accordance with a diagnosis result obtained by the diagnosis unit. The processing unit performs appropriate processing when an error is detected in data within a set range of the memory space in which the diagnosis unit is to be enabled.

13 Claims, 10 Drawing Sheets

CONTROLLER

This application claims priority from prior Japanese Patent Application No. 2016-112480 filed with the Japan Patent Office on Jun. 6, 2016, the entire contents of which are incorporated herein by reference.

FIELD

The present disclosure relates to a controller having the function of diagnosis of data stored in a memory space.

BACKGROUND

A stored-program computer successively executes programs stored in its main storage. The programs and data including variables used for executing the programs are electrically stored with, for example, electric charges.

When data is electrically stored, its values may be corrupted or altered under the influence of electrical noise, such as cosmic rays, static electricity, and other disturbances. Various methods are known to improve the error resilience of such data.

Techniques for detecting and correcting errors known in the art may use error detecting codes called parity bits, which are added to data when the data is stored. When the data is read, the read data and the corresponding parity bits are compared for detecting and correcting errors. Memory having this function may be referred to as error-correcting code (ECC) memory.

Japanese Unexamined Patent Application Publication No. 2009-146168 (Patent Literature 1) describes a technique for providing a component-mounting board for a programmable logic controller (PLC) that can support the specifications of an IO memory with a backup function and an IO memory with an ECC function at low cost.

However, the IO memory with the ECC function described for example in Patent Literature 1 includes a circuit configuration for implementing the ECC function and an additional capacity for storing parity bits, and is thus more costly than a memory without the ECC function. The memory without the ECC may thus have the function of self-diagnosis to prevent data corruption and misreading.

The memory self-diagnosis function is implemented as software in a program executed by a processor or in a circuit that reads data from the memory. This function adds an error-detecting code, such as a cyclic redundancy check (CRC), to data when the data is written, and diagnoses the data based on the error-detecting code when the data is read.

CITATION LIST

Patent Literature

Patent Literature 1: Japanese Unexamined Patent Application Publication No. 2009-146168

SUMMARY

Technical Problem

The memory self-diagnosis function described above is often implemented as software, and thus basically diagnoses all data sets to be written and to be read. Certain data to be written and read may permit errors, whereas other data may permit no error. Thus, the memory self-diagnosis function uniformly implemented for all the data sets would cause excessive processing of errors in data.

One or more aspects of the present invention are directed to a controller that sets the processing in accordance with an error that may occur in data.

Solution to Problem

A controller according to one aspect of the present invention for controlling a machine or a facility includes a storage unit, a diagnosis unit that diagnoses the presence of an error in data written in a memory space of the storage unit or data read from the memory space, and a processing unit that performs processing in accordance with a diagnosis result obtained by the diagnosis unit. The processing unit performs appropriate processing when an error is detected in data within a set range of the memory space in which the diagnosis unit is to be enabled.

In some embodiments, the controller further includes a setting unit that receives the set range of the memory space in which the diagnosis unit is to be enabled.

In some embodiments, the controller further includes a setting unit that sets the range of the memory space in which the diagnosis unit is to be enabled in response to an external instruction.

In some embodiments, the setting unit displays an area storing valid data in the memory space of the storage unit, and receives the set range for the displayed area.

In some embodiments, the range in which the diagnosis unit is to be enabled is set dynamically in a stage of generating an execution program to be executed by the processing unit.

In some embodiments, the diagnosis unit does not diagnose the presence of an error in data outside the range set by the setting unit.

In some embodiments, when the diagnosis unit detects an error in data outside the range set by the setting unit, the processing unit does not perform the appropriate processing.

In some embodiments, the controller further includes an output unit that outputs, to an external device, information indicating the range of the memory space in which the diagnosis unit is to be enabled.

In some embodiments, the memory space stores data to be written together with a redundancy code computed in correspondence with the data, and the diagnosis unit diagnoses the presence of an error based on whether the data read from the memory space and the corresponding redundancy code match.

In some embodiments, the diagnosis unit writes data to be written in an area specified in the memory space, reads the written data, and diagnoses the presence of an error based on the read data.

In some embodiments, the diagnosis unit writes data to be written in a first area specified in the memory space and a second area associated with the first area, reads the written data from the first area and the second area, and compares the data read from the first area and the data read from the second area to diagnose the presence of an error.

Advantageous Effects

The controller according to embodiments of the present invention sets the processing in accordance with an error that may occur in data.

DETAILED DESCRIPTION

Figure 1:
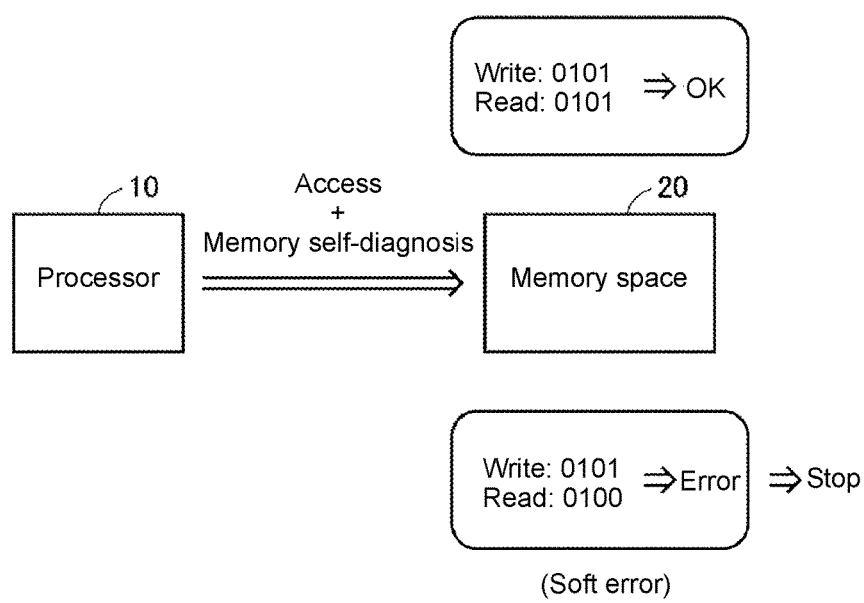
FIG. 1 is a schematic diagram showing an overview of the memory self-diagnosis function according to one embodiment.

An embodiment of the present invention will now be described in detail with reference to the drawings. The same or the corresponding components in the figures are given the same reference numerals, and will not be described repeatedly.

A. Background, Issues, and Solutions

A controller according to the present embodiment will now be described briefly based on its background, issues, and solutions. FIG. 1 is a schematic diagram showing an overview of the memory self-diagnosis function according to the present embodiment.

The memory self-diagnosis function used when a processor 10 accesses a memory space 20 will now be described with reference to FIG. 1. This memory self-diagnosis function diagnoses the presence of an error in data written in or read from the memory space of a storage unit. This function corresponds to a diagnosis unit.

For example, the processor 10 accesses the memory space 20 and writes data in the memory space 20. The written data is then read. The read data is compared with the originally written data to determine a match or a mismatch. In one example, data 0101 is written in the memory space 20, and then the written data is read from the memory space 20. When the read data is data 0101, the data is determined to have been written and read correctly. When the read data is data 0100 although data 0101 has been written in the memory space 20, the data is determined to have been either written or read erroneously.

Such erroneous writing or reading of data may occur under the influence of electrical noise (temporary external factors) such as cosmic rays, static electricity, and other disturbances. A failure mode in which a value in the memory space is temporarily corrupted or misread is also referred to as a soft error. Typically, a soft error caused by a temporary external factor rarely recurs in the same situation. Thus, identifying the fundamental cause of such soft errors is difficult. Taking effective measures against recurrence of such soft errors is not easy.

The memory self-diagnosis function is used in facilities intended with high reliability. Examples include a functional safety device that enables safe use of a machine at a manufacturing site. A safety controller, which is a typical example of a functional safety device, typically has the memory self-diagnosis function.

Figure 2:
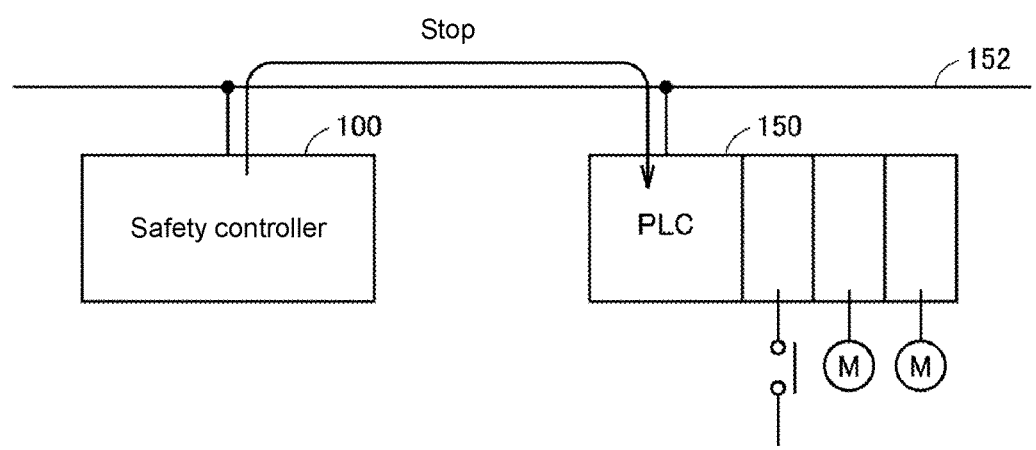
FIG. 2 is a schematic diagram showing the configuration of a system with the memory self-diagnosis function according to the embodiment.

FIG. 2 is a schematic diagram showing the configuration of a system with the memory self-diagnosis function according to the present embodiment. As shown in FIG. 2, a safety controller 100 is connected to a programmable logic controller (PLC) 150 with a network 152, and performs a monitoring process for the safety of a machine or a facility. When determining that the safety of the machine or facility is to be protected against an event, the safety controller 100 transmits, for example, a command for stopping the facility to the PLC 150.

Based on the concept of fail-safe, the safety controller 100 also transmits a stop command to the PLC 150 when detecting an abnormality of the safety controller 100. Such an abnormality is, for example, a loss of the monitoring function of the safety controller 100.

When the safety controller 100 with the above memory self-diagnosis function detects any error in, for example, its internal memory, the safety controller 100 outputs a stop command to the PLC 150. In response to the stop command, the facility controlled by the PLC 150 stops. This lowers the operating rate of the facility.

The data handled by the safety controller 100 may include less important data. In other words, the safety controller 100 may handle data needed to achieve its functional safety as well as other auxiliary data. Stopping the facility in response to an error in auxiliary data may degrade the balance of the safety assurance and the operating rate of the facility.

The controller according to the present embodiment enables or disables the memory self-diagnosis function and changes the use of an error detection result from the memory self-diagnosis function in accordance with, for example, the importance of data handled by the safety controller 100.

In one simple example, the memory self-diagnosis function is enabled for a memory area associated with safety-critical processing of the safety controller 100, and is disabled for the other memory area. The safety-critical processing herein refers to the processing for achieving, for example, the functional safety defined by an international standard.

Figure 3:
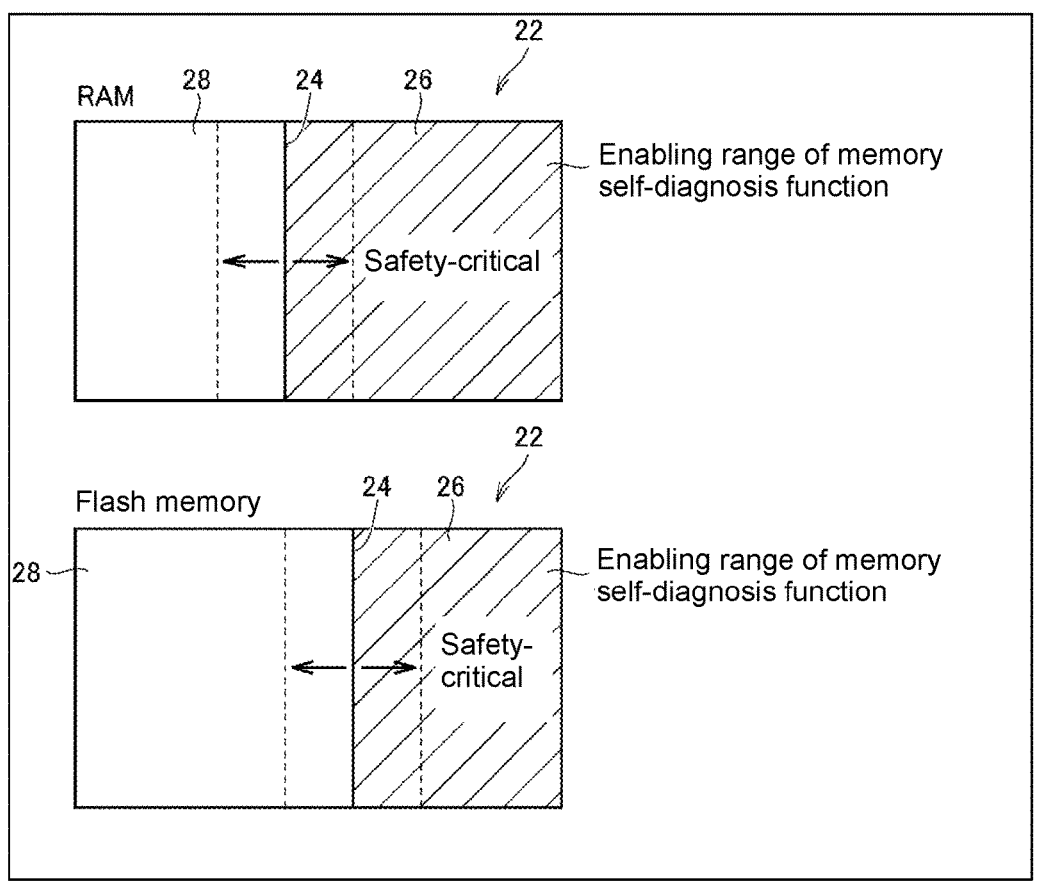
FIG. 3 is a schematic diagram describing the processing for changing the enabling range of the memory self-diagnosis function according to the embodiment.

FIG. 3 is a schematic diagram describing the processing for changing the enabling range of the memory self-diagnosis function according to the present embodiment. In the example of FIG. 3, a random access memory (RAM), which is volatile, and a flash memory, which is nonvolatile, each include a memory area 22. Each memory area 22 is then divided into a memory area 26 for storing data used in safety-critical processing and the other memory area 28. The memory area 28 may store data used in processing other than non-safety-critical processing or may store no valid data.

As shown in FIG. 3, the memory self-diagnosis function is enabled for the memory area 26 for storing the data used in safety-critical processing, and is disabled for the other memory area 28.

Enabling the memory self-diagnosis function refers to using the intended functions included in the memory self-diagnosis function. More specifically, when enabled, the memory self-diagnosis function performs the processing in accordance with the diagnosis result obtained from the memory self-diagnosis function, or for example transmits a command for stopping a target facility to the PLC 150 in response to an error detected in data (refer to FIG. 2).

In this manner, the controller according to the present embodiment performs the processing in accordance with an error detected in data stored in the memory area 26 set for storing data used in the safety-critical processing.

Disabling the memory self-diagnosis function refers to not using some or all the intended functions included in the memory self-diagnosis function. More specifically, when disabled, the memory self-diagnosis function performs no error detection for the memory area 28, or performs no further processing after detecting an error. In some embodiments, after detecting an error, the memory self-diagnosis function may automatically correct a fault associated with the error instead of stopping the facility, or may automatically restore the data when retaining the original data.

The controller according to the present embodiment may have the memory self-diagnosis function that does not diagnose the presence of an error in data outside the memory area 26 set for storing data used in the safety-critical processing. In some embodiments, when detecting an error in data outside the memory area 26 set for storing data used in the safety-critical processing, the memory self-diagnosis function may not perform appropriate processing in accordance with the error.

In the present embodiment, the memory area in which the memory self-diagnosis function is enabled and the data to be written are set and reset in a flexible manner. This maintains the predetermined functional safety and increases the operating rate of the overall facility by avoiding any excess fail-safe operation.

The memory areas 26 and 28 have a boundary 24 that may be defined and/or adjusted by the user. The boundary 24 may also be defined through syntax analysis or object analysis by a development environment (including a compiler and an assembler) for programs to be executed by the safety controller 100.

In this case, the boundary 24 may be defined using a physical position or a logical position. The boundary 24 defined using a logical position may define discrete parts in the physical memory area. In the present embodiment, the memory areas may be set in any manner that allows the processing to be determined for each data set.

For ease of explanation, the memory area in which the memory self-diagnosis function is enabled and the other memory area are defined separately in FIG. 3. In other words, the two memory areas are defined, one for the memory self-diagnosis function being enabled and the other for the memory self-diagnosis function being disabled. In some embodiments, more memory areas may be defined. For example, three memory areas may be defined as a first memory area in which the processing stops upon detection of an error by the memory self-diagnosis function, a second memory area in which an alarm is provided upon detection of an error by the memory self-diagnosis function and the processing is continued, and a third memory area in which the memory self-diagnosis function is disabled. In some other embodiments, more areas may be defined for any other processing.

B. Hardware Configuration of Safety Controller

Figure 4:
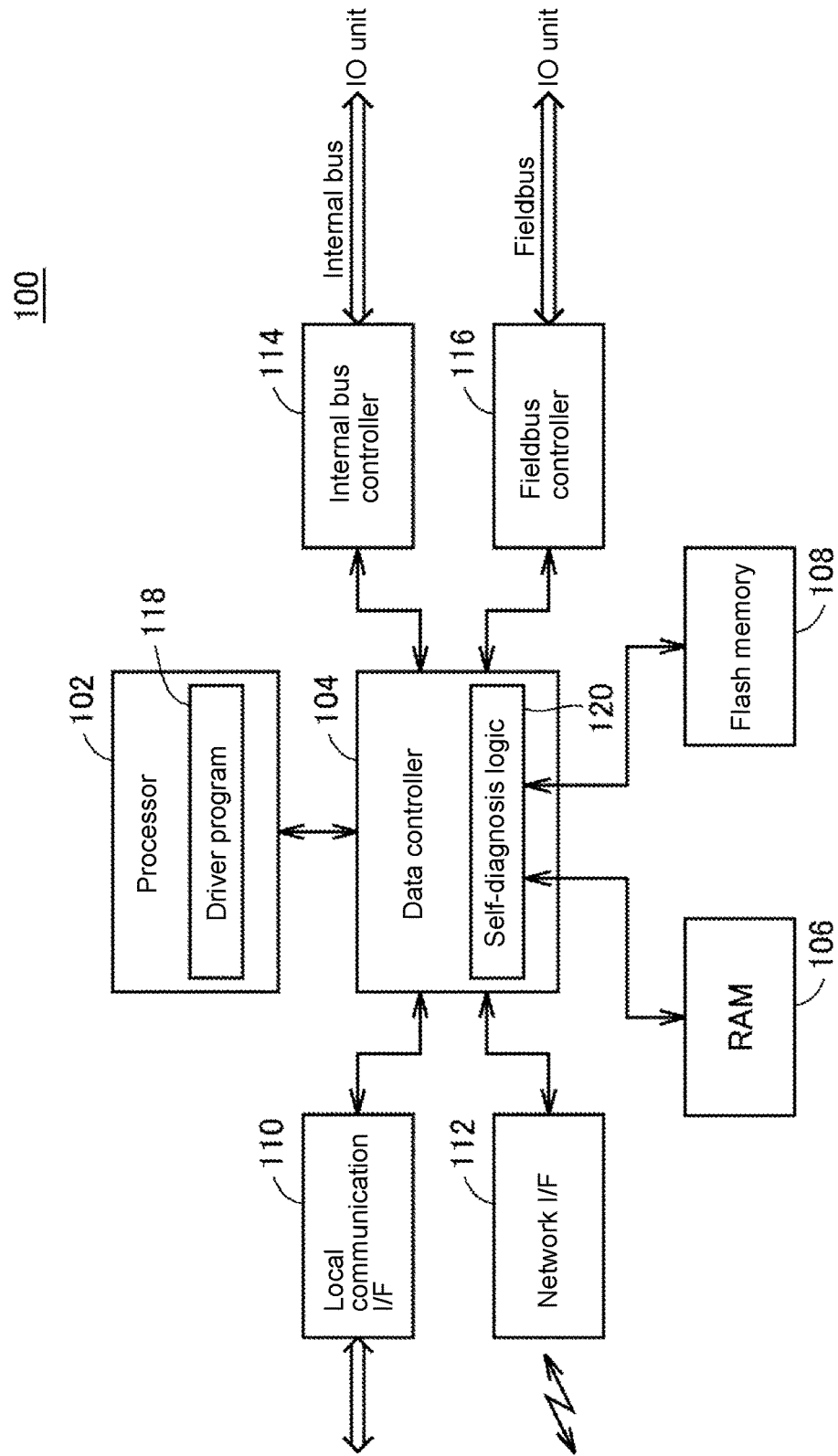
FIG. 4 is a schematic diagram showing the hardware configuration of a safety controller according to the embodiment.

The hardware configuration of the safety controller 100 will now be described as an example of the controller according to the present embodiment. FIG. 4 is a schematic diagram showing the hardware configuration of the safety controller 100 according to the present embodiment.

The safety controller 100 in FIG. 4 has the hardware configuration similar to the configuration of a PLC. The safety controller 100 includes, as its main components, a processor 102, a data controller 104, a RAM 106, a flash memory 108, a local communication interface (I/F) 110, a network interface 112, an internal bus controller 114, and a fieldbus controller 116.

The processor 102 is responsible for main computation, and executes system programs and user programs preinstalled in, for example, the flash memory 108.

The data controller 104 relays data between the processor 102 and each component.

The RAM 106 temporarily stores the codes of programs to be executed by the processor 102 and work data to be used in executing the programs. The flash memory 108 stores, in a nonvolatile manner, system programs and user programs to be executed by the processor 102.

The local communication interface 110 communicates data with a support apparatus (not shown) or other devices with, for example, a universal serial bus (USB). The network interface 112 communicates data with other information processing apparatuses (e.g., a PLC and a server) with, for example, Ethernet (registered trademark).

The internal bus controller 114 communicates data with an input-output (IO) unit (not shown) or other units with an internal bus. The fieldbus controller 116 communicates data with an IO unit or other units included in a remote IO apparatus (not shown) with a fieldbus.

Typical examples of the storage unit to have the memory self-diagnosis function according to the present embodiment include the RAM 106 and the flash memory 108 shown in FIG. 4. However, any unit that has a memory space for data may have this memory self-diagnosis function. For example, a cache memory or a register added to the processor, and a nonvolatile memory or a register in an IO unit may have this memory self-diagnosis function.

Examples of the processing unit for performing the processing in accordance with the diagnosis result obtained from the memory self-diagnosis function according to the present embodiment include the processor 102 shown in FIG. 4. The processing unit may be any unit that can perform the processing in accordance with an error detected by the memory self-diagnosis function.

The memory self-diagnosis function according to the present embodiment may be implemented in any manner. For example, the memory self-diagnosis function may be implemented by a driver program 118 included in a system program to be executed by the processor 102. The memory self-diagnosis function may also be implemented as the function of the data controller 104 using a hard-wired circuit such as an integrated circuit (IC) or a large scale integrated (LSI) circuit, or a microprocessor executing firmware. In this case, the data controller 104 incorporates a self-diagnosis logic 120 implemented with any configuration.

The memory self-diagnosis function according to the present embodiment is applicable to not only the safety controller 100 shown in FIG. 4, but may be applicable to any controller (e.g., a PLC) that controls a machine or a facility. Additionally, the function may be applied not only to the main computation unit of the safety controller or the PLC, but also to a secondary processing unit such as an IO unit or a remote IO apparatus.

C. Memory Self-diagnosis Function

Figure 5:
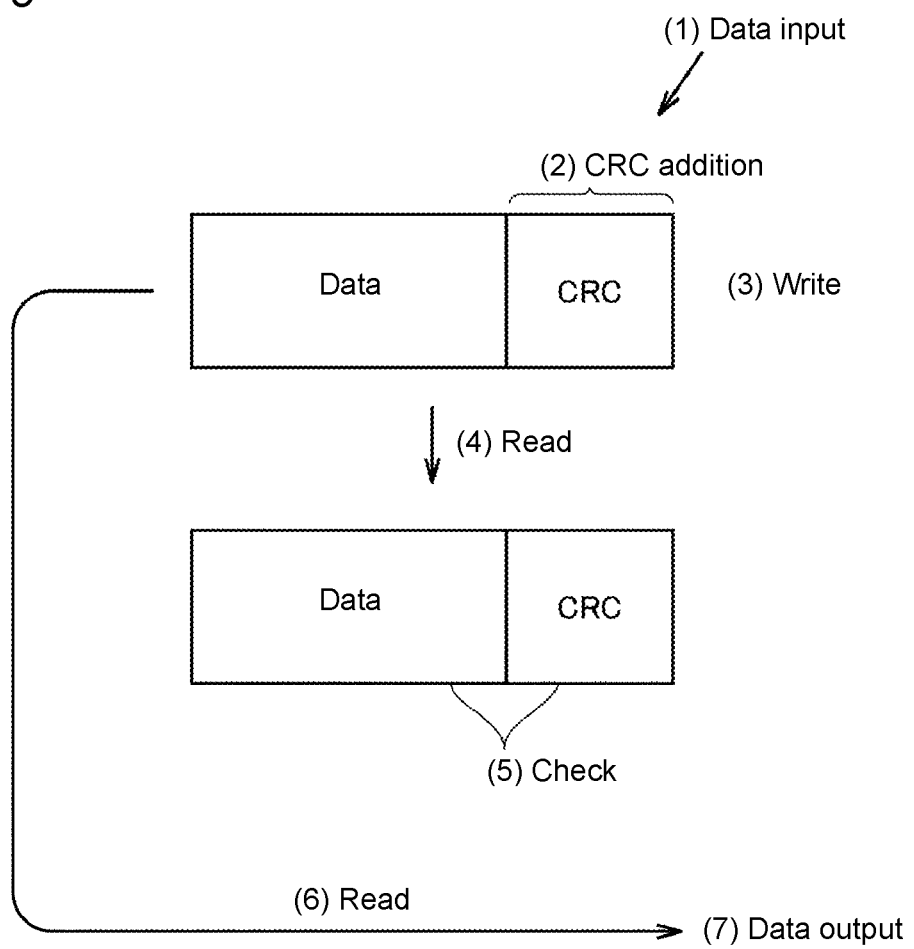
FIG. 5 is a diagram describing a procedure for implementing the memory self-diagnosis function according to the embodiment.
Figure 6:
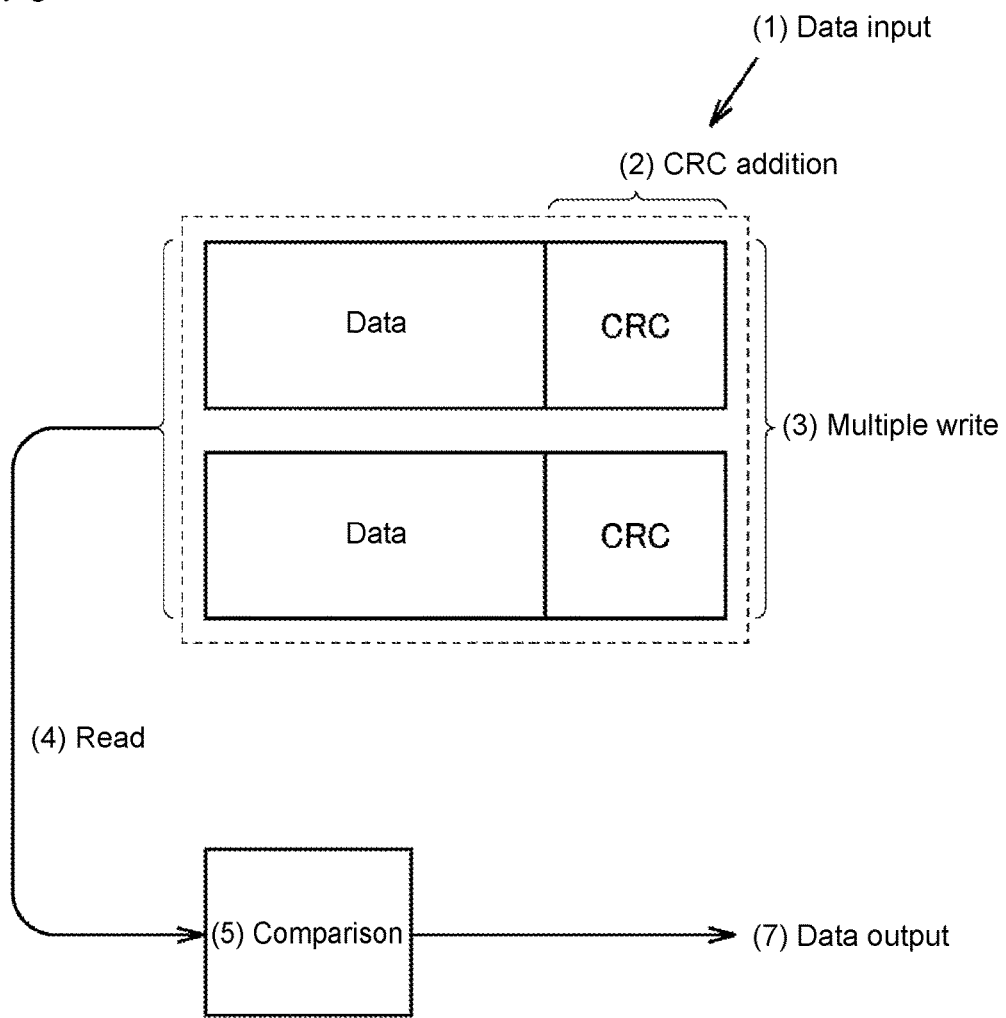
FIG. 6 is a diagram describing another procedure for implementing the memory self-diagnosis function according to the embodiment.

A specific example of the procedure of the memory self-diagnosis function according to the present embodiment will now be described. The memory self-diagnosis function according to the present embodiment diagnoses the presence of an error in data written in or read from the memory space of the storage unit. FIGS. 5 and 6 are diagrams describing the procedures for implementing the memory self-diagnosis function according to the present embodiment.

The memory space shown In FIGS. 5 and 6 stores data to be written as well as the redundancy code computed in correspondence with the data to be written. A cyclic redundancy check (CRC) is known as an example of such a redundancy code. A CRC is computed using a predetermined polynomial from the data to be written. The memory self-diagnosis function diagnoses the presence of an error based on whether the data read from the memory space and the corresponding redundancy code (CRC) match.

FIG. 5 shows a readback check method as one application. The readback check method is used to check data by reading data that is written in a memory space and determining whether the readout of the written data is correct. In other words, the memory self-diagnosis function writes data in an area specified in the memory space, reads the written data, and diagnoses the presence of an error based on the read data.

More specifically, when data to be written in any memory space is input ((1) Data input), a CRC is added to the input data ((2) CRC addition). The data with the CRC is then written in a specified memory space ((3) Write). Immediately after that, the written data is read from the memory space ((4) Read). The read data and the CRC are compared to determine whether the input data has been correctly written ((5) Check). In this check process, the function determines whether the CRC value computed from the read data using the above polynomial is identical to the read CRC value. When the CRCs match, the input data is determined to have been written correctly. When the CRCs do not match, the data is determined to have been written erroneously.

The correctly written data is subsequently read and output in response to a read command provided later ((6) Read and (7) Data output).

In this manner, the readback check method checks the integrity of written data every time when the data is written.

For data written in a memory space having the CRC computed from this data, the integrity of the written data can be checked at any appropriate timing using the CRC. For example, after data is correctly written in a memory space, the data may be partly altered due to electrical noise. The CRC allows posterior detection of such alteration of data.

Thus, another method for checking the integrity of data using a CRC may be used in addition to or instead of the readback check method shown in FIG. 5.

FIG. 6 shows an example of a multiple data check method. The multiple data check method is used to check data that is written in a memory space by writing the data in one area and also in another area associated with the area, and comparing the data sets read from the two areas and determining whether the data is correct. In other words, the memory self-diagnosis function writes data in a first area specified in the memory space and in a second area associated with the first area, reads the written data from the first area and the second area, and diagnoses the presence of an error by comparing the data read from the first area with the data read from the second area.

More specifically, when data to be written in any memory space is input ((1) Data input), a CRC is added to the input data ((2) CRC addition). The data with the CRC is then written in a specified first memory space area, and the same data (input data with the CRC) is written in a second memory space area paired with the first memory space area ((3) Multiple write). Immediately after that or when a read command is provided, the data is read from each of the paired first and second memory space areas, and the data read from the first area (first data) and the data read from the second area (second data) are compared with each other ((4) Read and (5) Comparison). The input data is determined to have been written correctly when the first data and the second data match. When the first data and the second data do not match, the data is determined to have been written erroneously. The correctly written data may be output as a readout ((7) Data output).

In this manner, the multiple data check method checks the integrity of written data every time when the data is written. The multiple data check method also allows determination of the validity of stored data at any appropriate timing. When, for example, either the first data or the second data is altered after the data is written in the memory space, the other data is unlikely to be altered in the same manner. Thus, the first data and the second data are compared with each other to detect a partial loss of the data or a mismatch between the first data and the second data.

Although FIG. 6 shows the configuration for adding a CRC to data, the multiple data check method may simply compare both the written data sets, and thus may not use the CRC. However, adding the CRC allows posterior check of the data integrity.

The memory self-diagnosis function may not be implemented with the methods shown in FIGS. 5 and 6, but may be implemented with any method that can check the integrity and the validity of written data.

D. Setting and Managing Memory Area in which Memory Self-diagnosis Function is Enabled As described above, the controller according to the present embodiment is capable of setting a memory space area in which the memory self-diagnosis function is enabled. A method for setting and managing a memory area in which the memory self-diagnosis function is enabled as shown in FIG. 3 in the memory area accessible to the safety controller 100 will now be described.

d1: Memory Area Setting

Typically, the memory area in which the memory self-diagnosis function is enabled in the memory area accessible to the safety controller 100 may be preliminarily set by the manufacturer of the controller or at a manufacturing stage. In this case, the preliminary set memory area may not be changed by the user or may be redefined by the user as appropriate for its use purpose or use environment. When the preliminary set memory area is unchangeable, a device for setting the memory area described below may not be provided to the user, and may be used by the manufacturer.

The memory self-diagnosis function may be enabled for the entire memory area by default before shipment from the manufacturer, and the user may change the setting as appropriate for the purpose or the environment of use.

d2: Direct Setting of Memory Area

For example, programs stored (installed) in a nonvolatile memory such as a flash memory basically remain at fixed storage locations. The memory area in which the memory self-diagnosis function is enabled may be manually set in a static state with the programs being stored.

Figure 7:
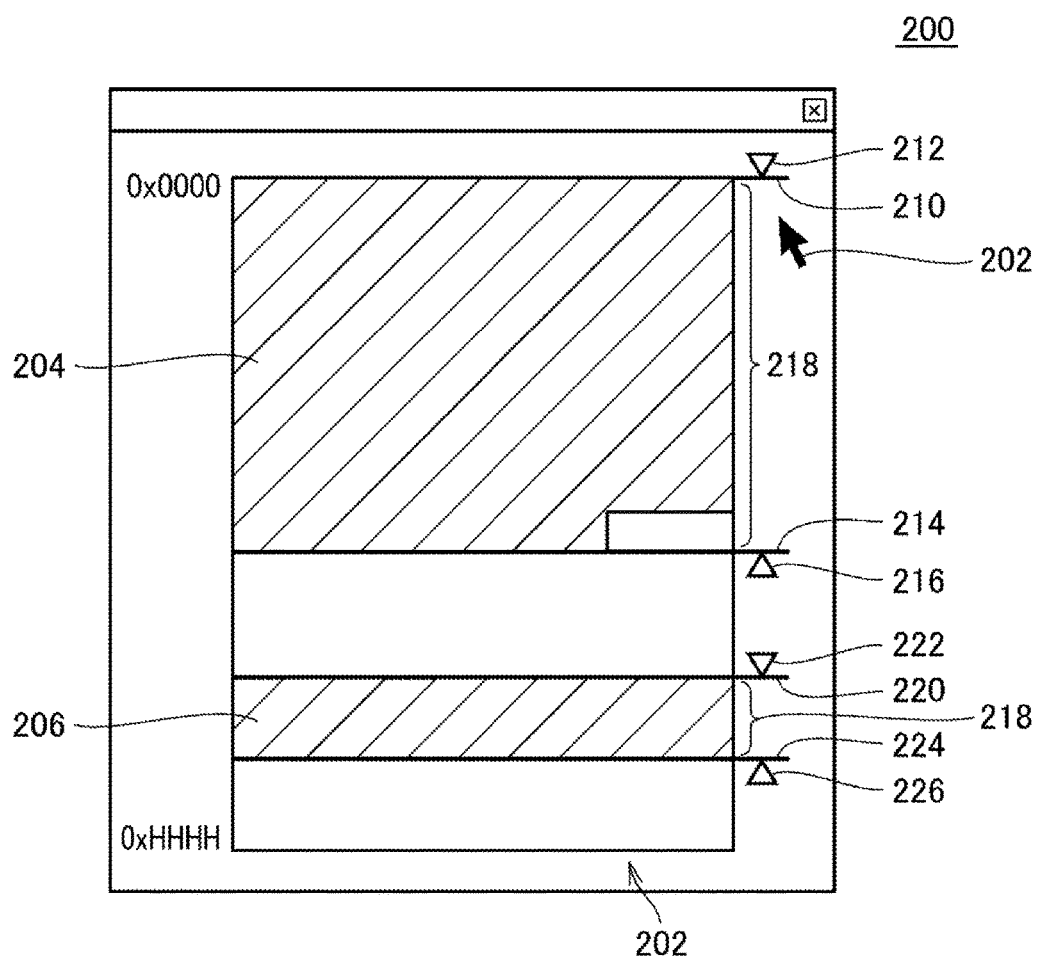
FIG. 7 is a diagram describing a method for setting memory areas in which the memory self-diagnosis according to the embodiment is enabled.

FIG. 7 is a diagram describing a method for setting memory areas in which the memory self-diagnosis according to the present embodiment is enabled. The safety controller 100 is connected to a support apparatus that provides a development environment and a debugging environment for programs such as a safety program. The support apparatus displays a setting screen 200 shown in FIG. 7.

The user operates the support apparatus to set a memory area in which the memory self-diagnosis function is enabled on the setting screen 200. More specifically, the setting screen 200 displays a map 202 showing the use of the target memory space. The map 202 is viewable in correspondence with the addresses in the memory area. The addresses on the map 202 are associated with displayable multiple sliders for setting memory areas.

The map 202 includes areas 204 and 206 storing data, which are displayed in a manner different from the other areas. While referring to the areas storing the data on the map 202, the user moves sliders 212, 216, 222, and 226 to set the memory areas in which the memory self-diagnosis is enabled.

In this manner, the setting capability, or the capability of receiving the setting of the memory space areas in which the memory self-diagnosis function is enabled includes displaying areas storing valid data in the memory space of the storage unit, and receiving the setting of the areas on the display.

In the example shown in FIG. 7, the slider 212 defines a starting position 210 of a memory area, and the slider 216 defines an end position 214 of the memory area. This defines a memory area 218 that ranges from the starting position 210 to the end position 214.

In the example shown in FIG. 7, the area 204 and the area 206 are spatially separate from each other, and the area 206 is associated with the sliders 222 and 226, which are displayed. More specifically, the slider 222 defines a starting position 220 of the memory area, and the slider 226 defines an end position 224 of the memory area. This defines a memory area 228 ranging from the starting position 220 to the end position 224.

With this procedure, the memory area 218 and the memory area 228 included in the memory space are set as the ranges in which the memory self-diagnosis function is enabled. In other words, the memory self-diagnosis function is disabled in memory areas other than the memory areas 218 and 228 in the memory space. This prevents an error caused by an external factor in any memory area storing no data from interrupting the processing for achieving the functional safety. Stopping the facility in response to an error in any memory area storing no data can lower the operating rate. The method according to the present embodiment sets the memory area in which the memory self-diagnosis function is enabled as appropriate to balance between the contradictory issues described above.

d3: Setting in Safety Program Generation

The safety program to be executed by the safety controller 100 may be generated using variables in a program. In this case, the program source code specifies relevant data as variables. The actual storage location of data to be written in the memory space may not be apparent to the user.

In the stage of generating the safety program, a memory area for storing data to be written may be automatically set by referring to the program source code.

Figure 8A:
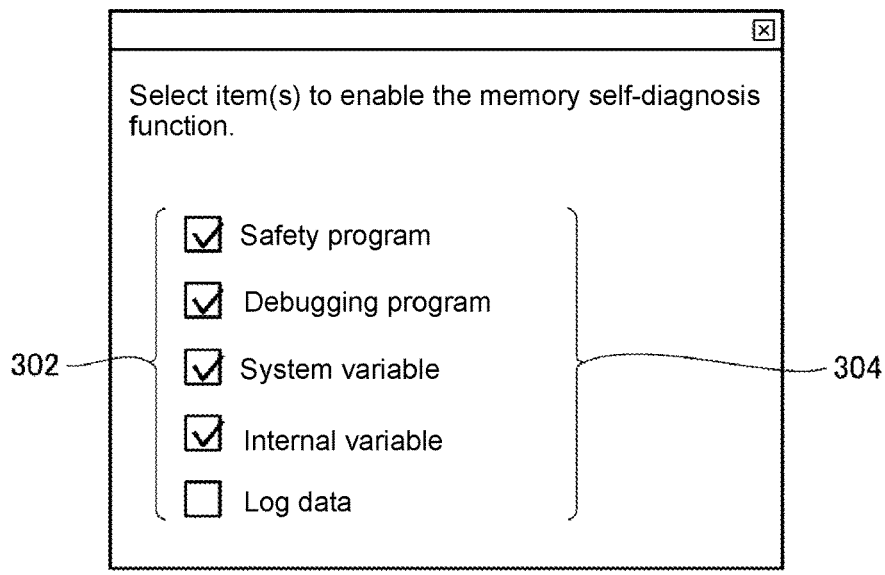
FIGS. 8A and 8B are diagrams describing another method for setting a memory area in which the memory self-diagnosis function according to the embodiment is enabled.
Figure 8B:
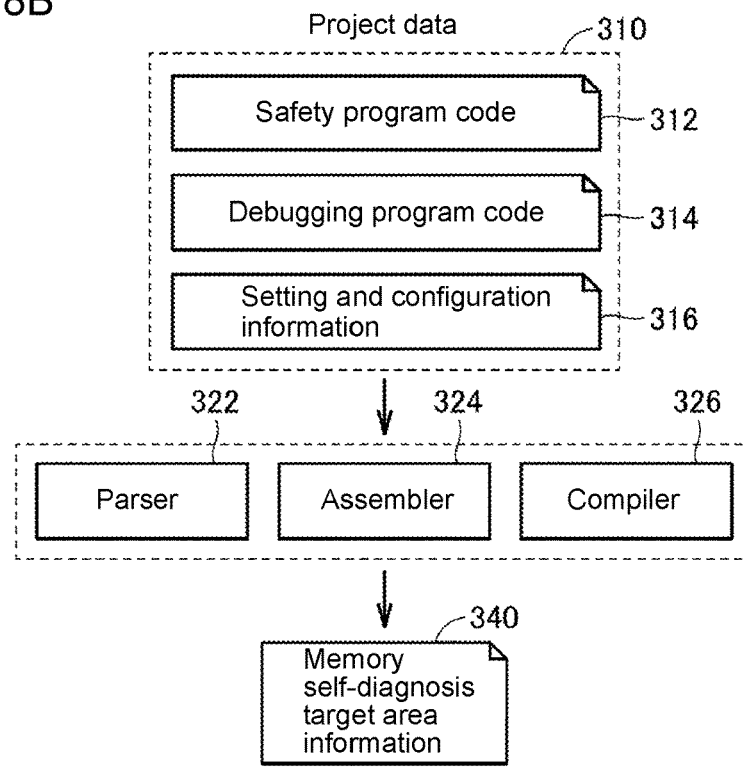

FIGS. 8A and 8B are diagrams describing another method for setting a memory area in which the memory self-diagnosis function according to the present embodiment is enabled.

In generating a safety program using the support apparatus, a setting screen 300 shown in FIG. 8A is displayed. The setting screen 300 lists programs to be executed by the safety controller 100, and variables and data to be used in the programs (reference numeral 304). The user selects an item for which the memory self-diagnosis function is to be enabled. More specifically, each item has a checkbox 302. The user can select an item for which the memory self-diagnosis function is to be enabled by checking its checkbox.

The program associated with the functional safety and the relevant data (including the safety program, the system variable, and the internal variable in the example shown in FIG. 8A) may be prohibited from being unchecked, or from being removed from the target items for which the function of memory self-diagnosis is to be enabled. This limitation ensures that the memory self-diagnosis function is enabled for any data to be used in the functional safety.

In accordance with the user settings on the setting screen 300 shown in FIG. 8A, memory self-diagnosis target area information 340 is generated with the procedure shown in FIG. 8B. More specifically, project data 310 including a safety program code 312, a debugging program code 314, and setting and configuration information 316 undergoes processing including analysis and conversion.

More specifically, a program group 320 including a parser 322, an assembler 324, and a compiler 326 successively processes the project data 310 to analyze the program source code and determine the location of an object. In addition, when an executable code is generated, a memory area to be used in the memory space is determined. The memory self-diagnosis target area information 340 is then generated for data items with checkmarks on the setting screen 300 shown in FIG. 8A based on the memory space in which the data is to be placed. In this manner, the range in which the memory self-diagnosis function is enabled may be set dynamically in the stage of generating the safety program, which is an execution program to be executed by the processor as the processing unit.

When the safety program is executed, the memory area in which the memory self-diagnosis function is enabled is set based on the memory self-diagnosis target area information 340.

In this manner, the memory area in which the memory self-diagnosis function is enabled is appropriately set when the memory area in which data is placed in the memory space may not be apparent to the user, or when, for example, the program uses variables.

d4: Setting in System with Dynamically Changed Data Location

During execution of the safety program by the safety controller 100, work data is generated and updated successively. Along with such dynamical generation and update of data, the memory area used for storing the data in the memory space changes over time. For the memory area that changes over time, the memory area in which the memory self-diagnosis function is enabled is to be set dynamically. Thus, the memory manager and the scheduler incorporated in the safety controller 100 may be used to successively change the memory area in which the memory self-diagnosis function is enabled.

Figure 9:
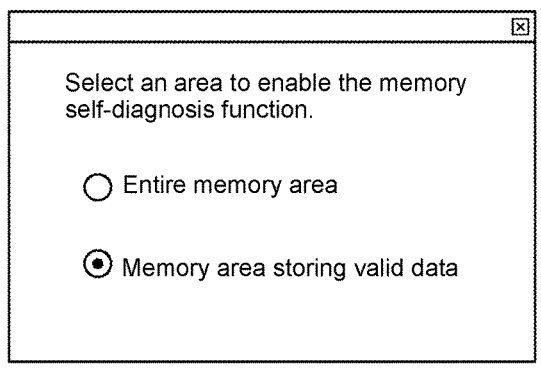
FIG. 9 is a diagram describing another method for setting a memory area in which the memory self-diagnosis function according to the embodiment is enabled.

FIG. 9 is a diagram describing another method for setting a memory area in which the memory self-diagnosis function according to the present embodiment is enabled. FIG. 9 shows a setting screen 400 on which the user can determine whether the memory self-diagnosis function is to be enabled in the entire memory area of the memory space or in memory areas actually storing data.

In accordance with the user setting performed on the setting screen 400, the memory manager and the scheduler of the safety controller 100 obtain a memory area currently storing data in the memory space in predetermined cycles, and enables the memory self-diagnosis function for the obtained memory area.

This setting capability enables the memory self-diagnosis function efficiently as appropriate for changes in the size or the position of memory areas storing data in the memory space, and reduces the possibility of the facility being stopped when unnecessary.

d5: Modification for Setting

Figure 10A:
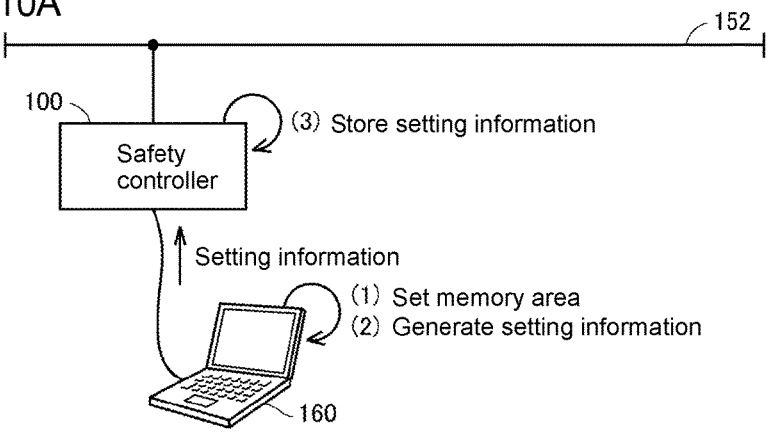
FIGS. 10A and 10B are schematic diagrams each showing a modification for setting a memory area for the memory self-diagnosis function according to the embodiment.
Figure 10B:
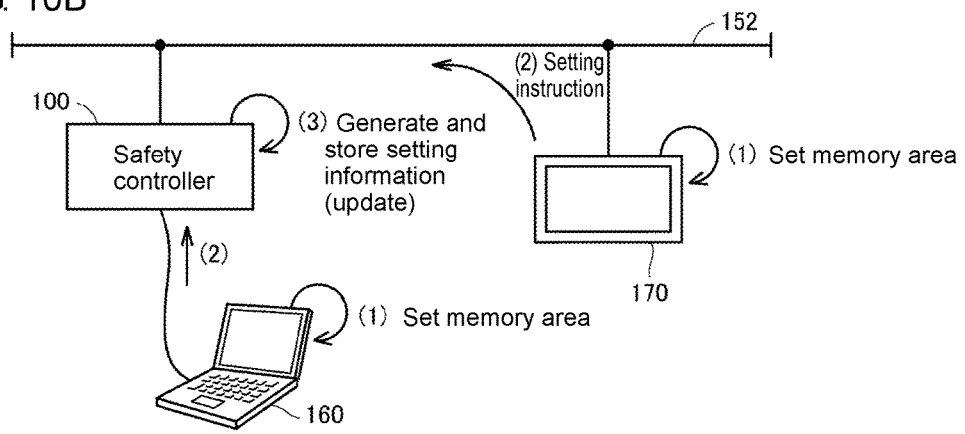

A modification for setting a memory area in which the memory self-diagnosis function is enabled will now be described. FIGS. 10A and 10B are schematic diagrams each showing a modification for setting a memory area for the memory self-diagnosis function according to the present embodiment.

As shown in FIG. 10A, the safety controller 100 is connected to, for example, a support apparatus 160. The user operates the support apparatus 160 to set a memory area in which the memory self-diagnosis function is to be enabled in the safety controller 100. When the setting is complete, the support apparatus 160 generates setting information. The generated setting information is transmitted to and stored in the safety controller 100.

In this manner, the setting capability to be added to the safety controller 100 includes receiving the setting of a range in which the memory self-diagnosis function is to be enabled in the memory space.

As shown in FIG. 10B, the safety controller 100 may be connected to the support apparatus 160 or to a display 170 with the network 152.

In this case, when the user operates the support apparatus 160 or the display 170 to set a memory area in which the memory self-diagnosis function is to be enabled in the safety controller 100, a setting instruction indicating the set area is transmitted to the safety controller 100. In response to the setting instruction from the support apparatus 160 or the display 170, the safety controller 100 internally generates setting information and stores the generated setting information. In other words, the safety controller 100 updates the internally stored setting information in response to the setting instruction transmitted from the support apparatus 160 or the display 170.

In this manner, the setting capability to be added to the safety controller 100 includes setting a range of the memory space in which the memory self-diagnosis function is to be enabled in response to an external instruction.

Modifications other than the example described above are also possible depending on the apparatus configuration or the system configuration.

d6: Checking the Setting

Figure 11A:
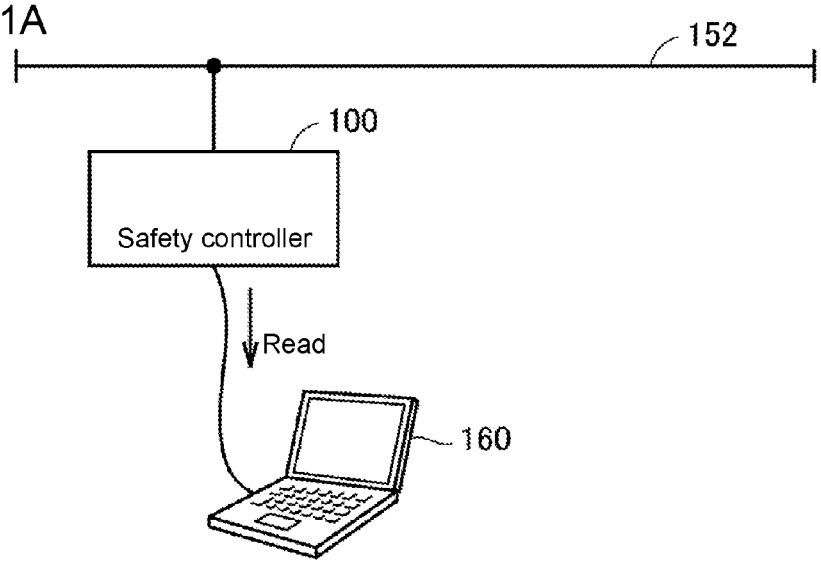
FIGS. 11A and 11B are schematic diagrams each showing a modification for checking the setting of a memory area for the memory self-diagnosis function according to the embodiment.
Figure 11B:
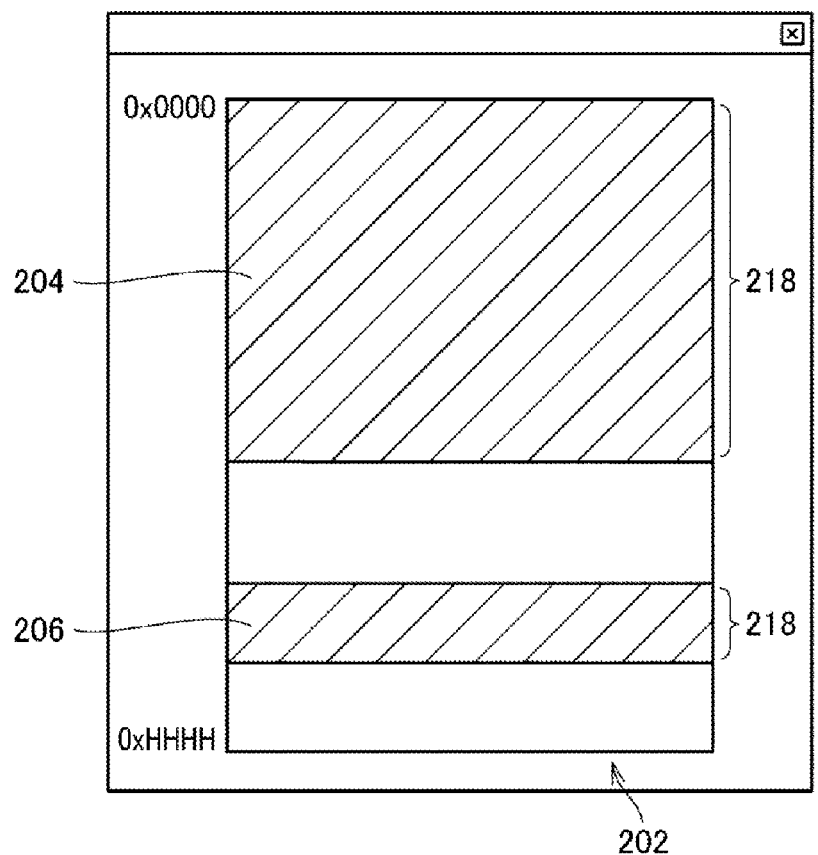

The above setting of the memory area in which the memory self-diagnosis function is enabled may be checked. FIGS. 11A and 11B are schematic diagrams each showing a modification for checking the setting of a memory area for the memory self-diagnosis function according to the present embodiment.

In FIG. 11A, the safety controller 100 is connected to, for example, the support apparatus 160. When the support apparatus 160 is operated to read the setting in the safety controller 100, the support apparatus 160 displays a setting confirmation screen 250 shown in FIG. 11B.

In this manner, the safety controller 100 may be capable of outputting information indicating a range in which the memory self-diagnosis function is to be enabled in the memory space to an external device, such as the support apparatus 160. The user can view the setting confirmation screen 250 to check the validity of the memory area in which the memory self-diagnosis function is to be enabled.

Modifications other than the examples described above are also possible depending on the apparatus configuration or the system configuration.

E. Procedure

Figure 12:
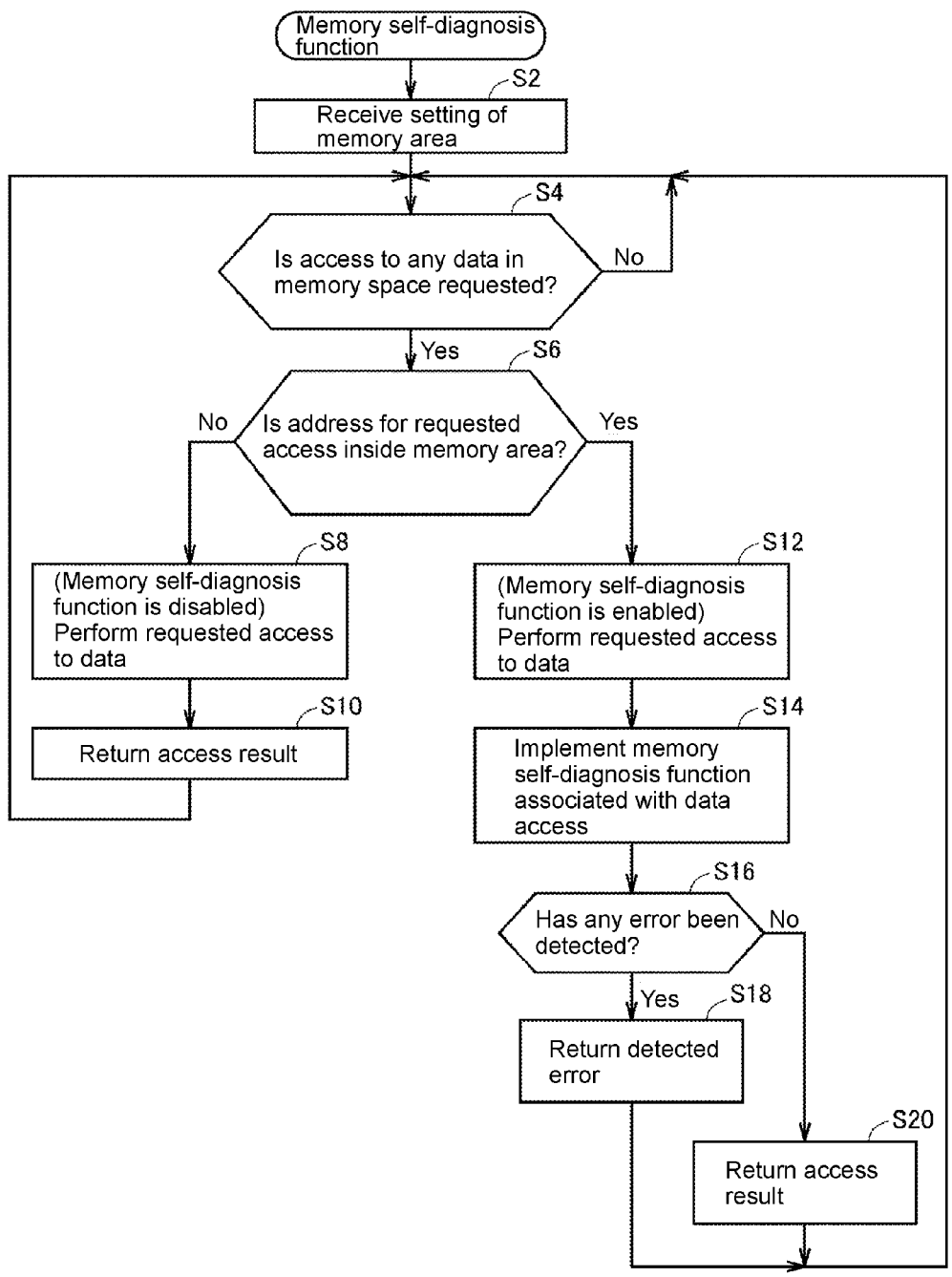
FIG. 12 is a flowchart showing the procedure for enabling the memory self-diagnosis function according to the embodiment.

The procedure for enabling the memory self-diagnosis function according to the present embodiment will now be described. FIG. 12 is a flowchart showing the procedure for enabling the memory self-diagnosis function according to the present embodiment. The steps shown in FIG. 12 may be performed by the processor 102 (refer to FIG. 4) executing the driver program 118 (refer to FIG. 4) or by the data controller 104 (refer to FIG. 4).

Referring now to FIG. 12, the setting of the memory area is received (step S2). This defines the memory area in which the memory self-diagnosis function is to be enabled.

The determination is then performed as to whether an access to any data in the memory space is requested (step S4). The access to the data includes at least either writing or reading the data. When no access to data in the memory space is requested (No in step S4), the processing in step S4 is repeated.

When an access to data in the memory space is requested (Yes in step S4), the determination is performed as to whether the address for the requested access is inside the memory area set in step S2 (step S6). When the address for the requested access is not inside the memory area set in step S2 (No in step S6), the memory self-diagnosis function is disabled, and the requested access to the data is performed (step S8). The result of the access is returned (step S10). The processing in step S4 and subsequent steps is then repeated.

When the address for the requested access is inside the memory area set in step S2 (Yes in step S6), the memory self-diagnosis function is enabled, and the requested access to the data is performed (step S12). The memory self-diagnosis function associated with the access to the data is then implemented (step S14). The determination is performed as to whether any error has been detected by the memory self-diagnosis function (step S16).

When any error is detected (Yes in step S16), information indicating the detected error is returned (step S18). When no error is detected (No in step S16), the result of the access is returned (step S20). The processing in step S4 and subsequent steps is then repeated.

While the safety controller 100 is valid and is operating, the processing in steps S2 to S20 is repeated.

F. Application Target

The memory self-diagnosis function according to the present embodiment described above and its associated applications can be implemented in any memory that can be accessed by a controller processor (e.g., an internal volatile memory, an internal nonvolatile memory, and an external memory). The memory self-diagnosis function and its associated applications can also be implemented in an internal cache or a register.

The memory self-diagnosis function and its associated applications are implementable in, for example, an IO unit or a remote IO apparatus. They are also implementable in a system that is integral with part or all of the controller.

The capability of setting a memory area in which the memory self-diagnosis function is to be enabled may be provided by the safety controller or the support apparatus connected to the PLC, or by firmware for the safety controller. All or part of the capability described above may also be provided in cooperation with an external server.

G. Advantages

The controller according to the present embodiment sets the processing in accordance with an error that may occur in data. This structure can achieve the functional safety in a reliable manner, and reduces the possibility that an error in a part unrelated to the functional safety under the influence of electrical noise, such as cosmic rays, static electricity, and other disturbances, stops a machine or a facility and decreases its operating rate. In other words, this structure responds to the contradictory issues, or achieving the functional safety and maintaining the operating rate of the machine and the facility.

The embodiments disclosed herein should be considered to be in all respects illustrative and not restrictive. The scope of the invention is defined by the appended claims, and it is intended that all changes fall within the claims and equivalent meanings and ranges.

REFERENCE SIGNS LIST 10, 102 processor
20 memory space
22, 26, 28, 218, 228 memory area
24 boundary
100 safety controller
104 data controller
106 RAM
108 flash memory
110 local communication interface
112 network interface
114 internal bus controller
116 fieldbus controller
118 driver program
120 self-diagnosis logic
150 PLC
152 network
200, 300, 400 setting screen
202 map
204, 206 area
210, 220 starting position
212, 216, 222, 226 slider
214, 224 end position
302 checkbox
310 project data
312 safety program code
314 debugging program code
316 configuration information
320 program group
322 parser
324 assembler
326 compiler
340 memory self-diagnosis target area information

The invention claimed is:

1. A controller for controlling a machine or a facility, the controller comprising:
a storage unit; and
a processor configured with a program to perform operations comprising:
operation as a diagnosis unit configured to diagnose a presence of an error in data written in a memory space of the storage unit or data read from the memory space; and
operation as a processing unit configured to set an execution program to be executed by the processing unit in response to the diagnosis unit detecting the error in a data set stored within a set range of the memory space in which operation of the diagnosis unit is to be enabled, wherein
the set range is defined based on processing to be performed on the data.

2. The controller according to claim 1, wherein the processor is configured with the program to perform operations further comprising:
operation as a setting unit configured to receive the set range of the memory space in which the diagnosis unit is to be enabled.

3. The controller according to claim 2, wherein the processor is configured with the program such that operation as the setting unit comprises operation as the setting unit that displays an area storing valid data in the memory space of the storage unit, and receives the set range for the displayed area.

4. The controller according to claim 2, wherein the processor is configured with the program such that operation as the diagnosis unit comprises operation as the diagnosis unit that does not diagnose the presence of an error in data outside the range set by the setting unit.

5. The controller according to claim 2, wherein the processor is configured with the program such that operation as the processing unit comprises operation as the processing unit that, in response to the diagnosis unit detecting an error in data outside the range set by the setting unit, does not execute the execution program.

6. The controller according to claim 1, wherein the processor is configured with the program to perform operations further comprising:
operation as a setting unit configured to set the range of the memory space in which the diagnosis unit is to be enabled in response to an external instruction.

7. The controller according to claim 1, wherein the processor is configured with the program such that the range in which the diagnosis unit is to be enabled is set dynamically in a stage of generating the execution program to be executed by the processing unit.

8. The controller according to claim 1, wherein the processor is configured with the program to perform operation further comprising:
operation as an output unit configured to output, to an external device, information indicating the range of the memory space in which the diagnosis unit is to be enabled.

9. The controller according to claim 1, wherein the processor is configured with the program such that:
the memory space stores data to be written together with a redundancy code computed in correspondence with the data; and
operation as the diagnosis unit comprises operation as the diagnosis unit that diagnoses the presence of an error based on whether the data read from the memory space and the corresponding redundancy code match.

10. The controller according to claim 1, wherein the processor is configured with the program such that operation as the diagnosis unit comprises operation as the diagnosis unit that writes data to be written in an area specified in the memory space, reads the written data, and diagnoses the presence of an error based on the read data.

11. The controller according to claim 1, wherein the processor is configured with the program such that operation as the diagnosis unit comprises operation as the diagnosis unit that writes data to be written in a first area specified in the memory space and a second area associated with the first area, reads the written data from the first area and the second area, and compares the data read from the first area and the data read from the second area to diagnose the presence of an error.

12. The controller according to claim 1, wherein the set range is defined based on a program selected for which the operation of the diagnosis unit is to be enabled.

13. The controller according to claim 12, wherein the program selected for which the operation of the diagnosis unit is to be enabled comprises a program performing safety-critical processing.

* * * * *